US007053699B2

(12) United States Patent
North

(10) Patent No.: US 7,053,699 B2
(45) Date of Patent: May 30, 2006

(54) CURRENT OUTPUT STAGES

(75) Inventor: Brian North, Los Gatos, CA (US)

(73) Assignee: Elantec Semiconductor, Inc., Milpitas, CA (US)

( * ) Notice: Subject to any disclaimer, the term of this patent is extended or adjusted under 35 U.S.C. 154(b) by 143 days.

(21) Appl. No.: 10/843,253

(22) Filed: May 11, 2004

(65) Prior Publication Data

US 2005/0253645 A1 Nov. 17, 2005

(51) Int. Cl.
*H03F 1/34* (2006.01)
*G05F 1/10* (2006.01)

(52) U.S. Cl. ........................ 327/590; 327/108; 330/288

(58) Field of Classification Search ..................... None
See application file for complete search history.

(56) References Cited

U.S. PATENT DOCUMENTS

| | | | | |
|---|---|---|---|---|
| 4,335,360 | A | 6/1982 | Hoover | 330/264 |
| 4,558,287 | A * | 12/1985 | Tanaka | 330/257 |
| 4,591,739 | A * | 5/1986 | Nagano | 323/311 |
| 4,733,196 | A | 3/1988 | Menniti et al. | 330/288 |
| 4,814,724 | A | 3/1989 | Tanigawa | 330/288 |
| 5,311,147 | A | 5/1994 | Petty et al. | 330/290 |
| 5,376,900 | A | 12/1994 | Debroux | 330/271 |
| 5,475,343 | A | 12/1995 | Bee | 330/255 |
| 5,500,625 | A | 3/1996 | Rincon et al. | 330/273 |
| 5,568,090 | A | 10/1996 | Pierret | 330/255 |
| 5,754,066 | A | 5/1998 | Smith | 327/108 |
| 6,184,750 | B1 | 2/2001 | Somerville | 330/255 |
| 6,278,326 | B1 | 8/2001 | Murray et al. | 330/288 |
| 6,292,057 | B1 | 9/2001 | Corsi et al. | 330/273 |
| 6,384,684 | B1 * | 5/2002 | Redman-White | 330/263 |
| 6,411,167 | B1 | 6/2002 | Laaser | 330/264 |
| 6,586,998 | B1 | 7/2003 | Moraveji | 330/267 |
| 6,714,081 | B1 * | 3/2004 | Xu | 330/296 |
| 6,724,260 | B1 | 4/2004 | Varner et al. | 330/288 |
| 6,731,164 | B1 | 5/2004 | Johnston | 330/85 |
| 6,995,615 | B1 * | 2/2006 | Zhao | 330/308 |

* cited by examiner

*Primary Examiner*—Timothy P. Callahan
*Assistant Examiner*—Terry L. Englund
(74) *Attorney, Agent, or Firm*—Fliesler Meyer LLP

(57) ABSTRACT

Current output stages are provided. In accordance with an embodiment, a current output stage includes a voltage follower circuit, a first current mirror and a second current mirror. A node of the voltage follower circuit provides a voltage that follows a voltage at the output of the current output stage. An input of the first current mirror is connected (e.g., by a current path of a transistor) to the node of the voltage follower circuit that follows the voltage at the output of the current output stage. An output of the first current mirror is connected to an input of the second current mirror. An output of the second current mirror is connected to the input of the current output stage.

36 Claims, 5 Drawing Sheets

CURRENT OUTPUT STAGES

FIELD OF THE INVENTION

Embodiments of the present invention relate to the field of integrated circuits, and more specifically, to current output stages.

BACKGROUND

A simple current mirror can be used as a current output stage. However, in general, the output impedance of a simple current mirror is too low to allow good linearity into a load with large voltage excursions. The usual method of improving the output resistance is to cascode the output transistor of the current mirror. Unfortunately, cascoding the output section of a high current mirror requires a significant amount of voltage headroom, which detracts from the maximum available output swing available. In addition, the cascode transistor will need to handle the full output current, and therefore, must be a relatively large component. This is especially true if the control terminal (e.g., drain or base) of the cascode transistor needs to be extended for electrostatic discharge (ESD) protection reasons. It would be preferable if a current output stage can provide a high-output impedance without occurring the above mentioned disadvantages.

SUMMARY OF THE PRESENT INVENTION

In accordance with an embodiment of the present invention, a current output stage includes a voltage follower circuit, a first current mirror and a second current mirror. A node of the voltage follower circuit provides a voltage that follows a voltage at the output of the current output stage. An input of the first current mirror is connected (e.g., by a current path of a transistor) to the node of the voltage follower circuit that follows the voltage at the output of the current output stage. An output of the first current mirror is connected to an input of the second current mirror. An output of the second current mirror is connected to the input of the current output stage. Through this arrangement, a proportion of the output current (produced at the output of the current output stage) is fed back to the input of the current output stage, allowing relatively small voltage and current swings at the input of the current output stage, while allowing relative large voltage and current swings at the output of the current output stage.

Some embodiments of the present invention provide a current output stage that has essentially a one-sided output that is ideal for signals that move only in one direction relative to a static zero operating point. By providing a suitable offset bias current, embodiments of the present invention can provide a bi-directional output.

Some embodiments of the present invention can also be used to produce a single ended output from a differential input.

Some embodiments of the present invention provide current sink output stages. Other embodiments of the present invention provide current source output stages. Still other embodiments of the present invention use both a current sink output stage and a current source output stage to produce a differential push-pull output.

Further embodiments and details, and the features, aspects, and advantages of the present invention will become more apparent from the detailed description set forth below, the drawings and the claims.

DETAILED DESCRIPTION

The overall function of the current output stages described herein behave in a similar way to that of simple current mirrors. However, output stages of the present invention have a number of advantages when driving reasonably large currents (on the order of milli-Amps) into a load with large voltage excursions.

Figure 1:
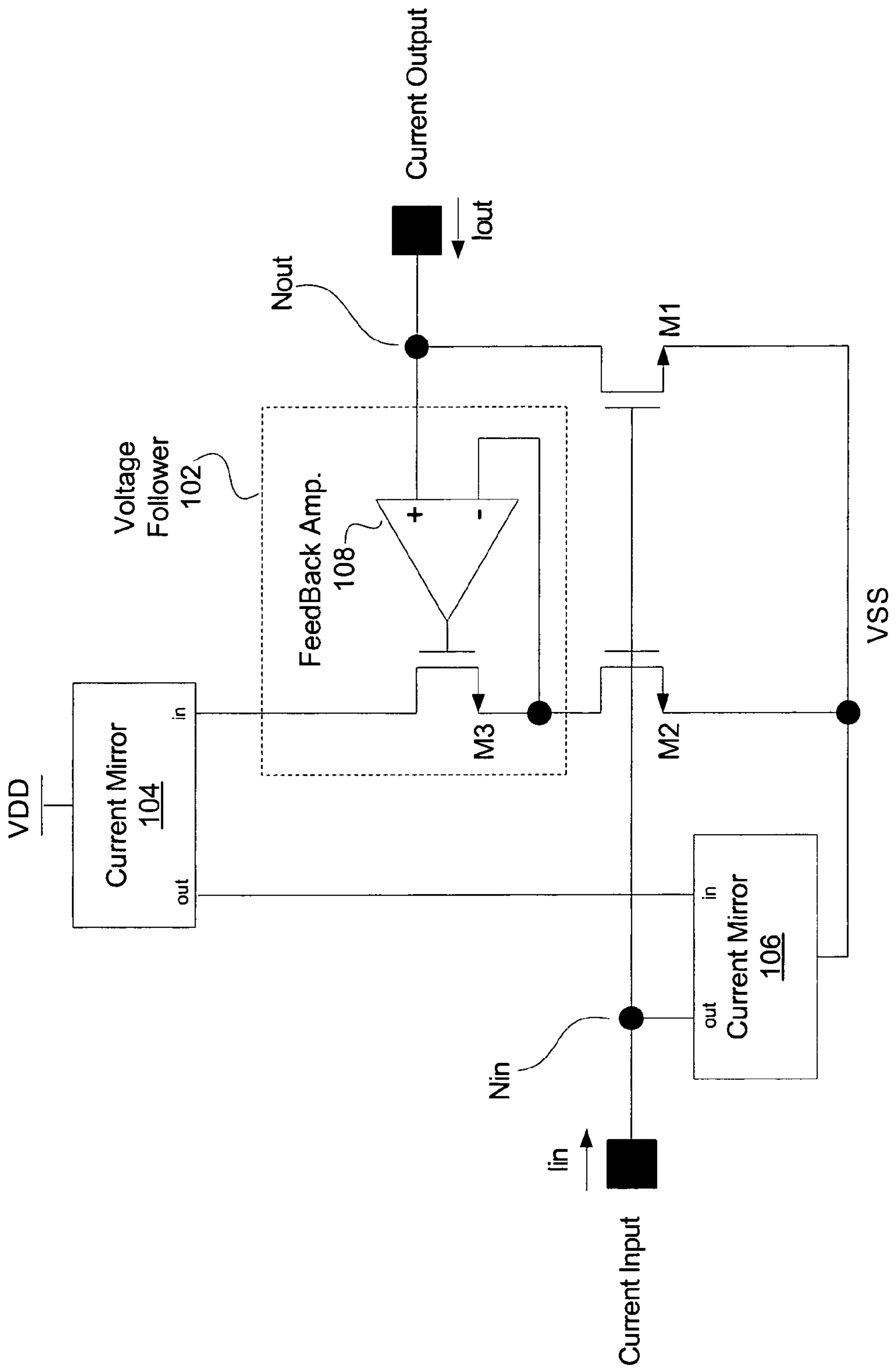
FIG. 1 is a high level block diagram useful for explaining a current output stage according to an embodiment of the present invention.

FIG. 1 will be used to describe the basic circuit concept of a current output stage according to an embodiment of the present invention. As shown in FIG. 1, the current output stage includes a current input node (Nin) and a current output node (Nout), a pair of current mirrors 104 and 106, a voltage follower circuit 102, and a pair of transistors M1 and M2 connected in a common source and a common gate configuration. The voltage follower circuit 102 is shown as including a feedback amplifier 108 and a transistor M3, in accordance with an embodiment of the present invention. A non-inverting (+) input of the feedback amplifier 108 is connected to the output node (Nout). An inverting (−) input of the feedback amplifier 108 is connected to the source of transistor M3, as well as to the drain of transistor M2. An output of the feedback amplifier is connected to the gate of transistor M3. The drain of transistor M3 is connected to an input of the current mirror 104. An output of the current mirror 104 is connected to an input of the current mirror 106. An output of the current mirror 106 is connected to the input node (Nin), which is also connected to the gates of transistor M2 and M1.

Still referring to FIG. 1, the voltage follower circuit 102 causes a voltage across transistor M2 to follow an output voltage, which is the drain-source voltage of transistor M1. Hence transistor M1 and transistor M2 experience the same drain-source voltage conditions and therefore the drain currents of transistor M1 and transistor M2 will track each other. The drain current of transistor M2 is then mirrored twice, using current mirrors 104 and 106, back to the input node (Nin) where, under the overall negative feedback of the loop, it cancels a substantial portion of the input current (Iin). In this manner, the input node (Nin) sees only small swings in current and voltage. The only node that sees large swings is the output node (Nout), and hence the current mirrors 104 and 106 can be simple or conventional cascoded types, but are not limited thereto.

Figure 2A:
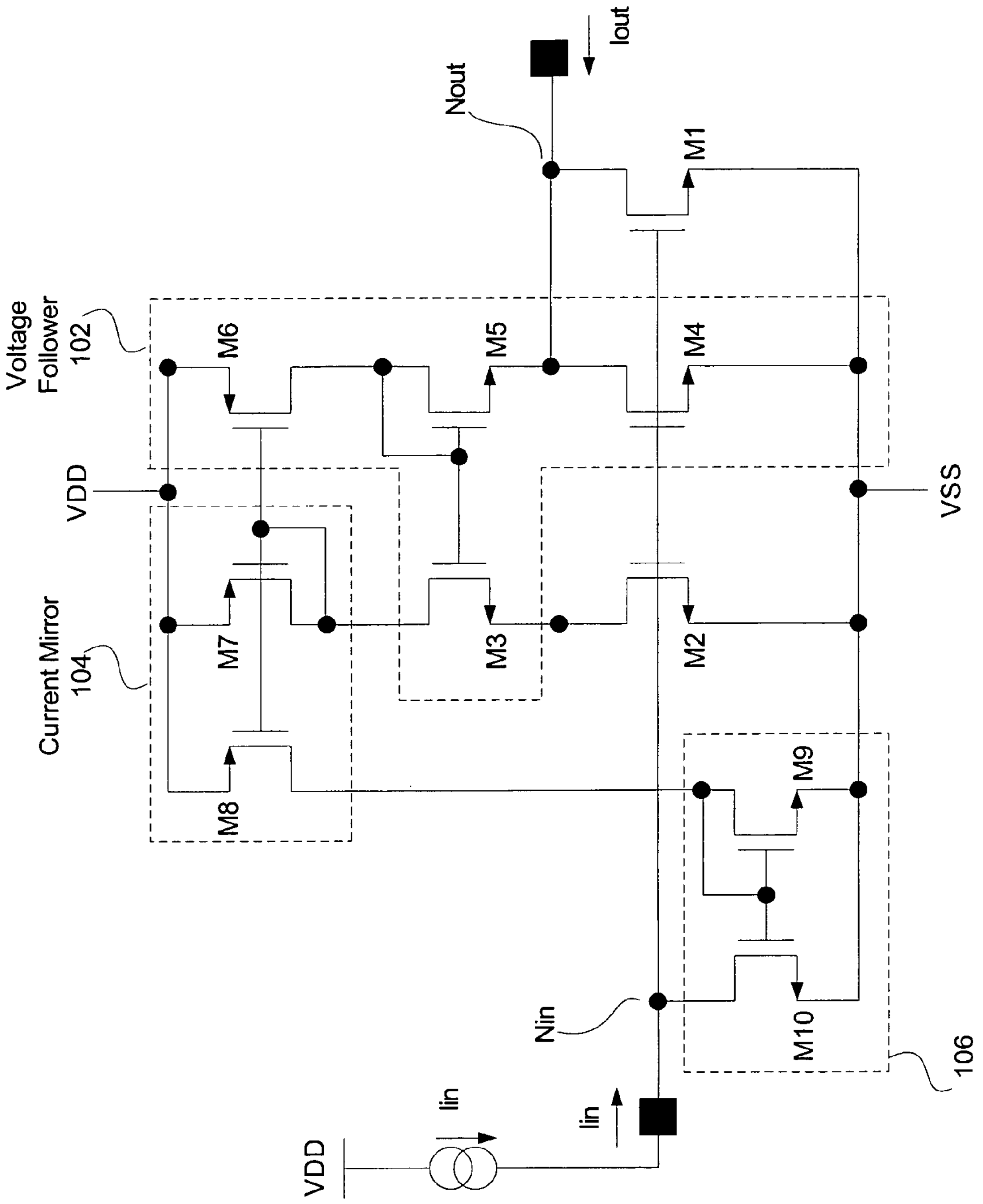
FIG. 2A is a circuit diagram that implements a current output stage in accordance with an embodiment of the present invention.

Referring now to FIG. 2A, in accordance with an embodiment of the present invention, the voltage follower circuit 102 is shown as including transistor M3, as well as transistors M4, M5 and M6. Transistor M4 is connected in a common source and a common gate configuration with transistors M1 and M2. The drain of transistor M4 is connected to the source of transistor M5 at the output node (Nout) of the current output stage. The drain and the gate of transistor M5 are connected together, as well as to the gate of transistor M3. The drain of transistor M5 is also connected to the drain of transistor M6. Transistor M6 is shown as being a PMOS transistor, with its source connected to a supply rail voltage VDD (e.g., 3.3V). Transistors M3, M4 and M5 are shown as being NMOS transistors, with the source of transistor M4 being connected to a supply rail voltage VSS (e.g., 0V).

In accordance with an embodiment of the present invention, the current mirror 104 includes a transistor M7 and a transistor M8, which are connected in a common source configuration and a common gate configuration. The gate and the drain of transistor M7 are connected together. The drain of transistor M7 forms the input of the current mirror 104, and the drain of transistor M8 forms the output of the current mirror 104. Transistors M7 and M8 are shown as being PMOS transistors, with their sources connected to the supply voltage rail VDD (e.g., 3.3V).

In accordance with an embodiment of the present invention, the current mirror 106 includes a transistor M9 and a transistor M10 that are connected in a common source configuration and a common gate configuration. The gate and the drain of transistor M9 are connected together. The drain of transistor M9 forms the input of the current mirror 106, and the drain of transistor M10 forms the output of the current mirror 106. Transistors M9 and M10 are shown as being N-channel complimentary-metal-oxide-semiconductor (NMOS) transistors, with their sources connected to the supply voltage rail VSS (e.g., 0V).

Since transistor M6 is connected in a common source and a common gate configuration with transistors M7 and M8 of the current mirror 104, the current at the drain of transistor M6 will be equal to the currents at the input and the output of the current mirror 104 (assuming for simplicity that transistors M6, M7 and M8 are the same size, which they need not be). The current at the drain of transistor M6 flows through transistor M5 and through transistor M4 to the supply rail voltage VSS, providing no contribution to the output current (Iout). The current at the drain of transistor M7 (which is the same as the current at the drain of transistor M6, as mentioned above, assuming common sized transistors) flows through transistor M3, causing substantially the same current to flow through transistor M3 as through transistor M5. This arrangement will cause the voltage at the source of transistor M3 to follow the voltage at the source of transistor M5, which is the same as the output voltage (i.e., the source-drain voltage across transistor M1). Stated another way, transistor M5 is used to sense the output voltage at its source, while transistor M3 is used to replicate the same output voltage at its source. Hence transistor M1 and transistor M2 experience the same drain-source voltage conditions and therefore the drain currents of transistor M1 and transistor M2 will track each other.

The transistor pair M7 and M8 of current mirror 104, and the transistor pair M9 and M10 of current mirror 106, redirect the drain current of transistor M2 to the input node (Nin) of the current output stage, where it cancels a substantial portion of the input current (Iin). In this manner, the only node that sees a large voltage swing is the output node (Nout) of the current output stage.

Transistors M7 and M6 (which implement a current mirror) ensure that that the current density through transistor M5 tracks with the current density through transistor M3. Since the current density in transistors M5 and M3 are the same, then the voltage at the drain of transistor M2 will accurately track the voltage at the output node (Nout) of the current output stage.

The overall current gain from the input node (Nin) to the output node (Nout) is controlled by the ratio of the sizes of transistors M1 and M2, as well as the feedback mirror ratios. These internal mirror transistors are shown as uncascoded for clarity, but in practice they would likely be cascoded to reduce offset errors and power supply variation sensitivity. Accordingly, embodiments of the present invention also cover current mirrors where the transistors of the mirrors are cascoded.

The current output stage circuit achieves good matching under all conditions because of the thermal matching of transistors M1, M2 and M4. The thermal matching is due to the fact that all three transistors have the same current density and the same drain-source voltage.

It is noted that since transistors M4 and M1 are in parallel, it is possible to implement the same functionality by incorporating the effects of transistor M4 into transistor M1. This can be accomplished by making M1 larger in size, thus effectively eliminating transistor M4. However, it is believed that circuits can be more easily implemented if transistors M4 and M1 are kept separate transistors as shown in the given figures.

Figure 2B:
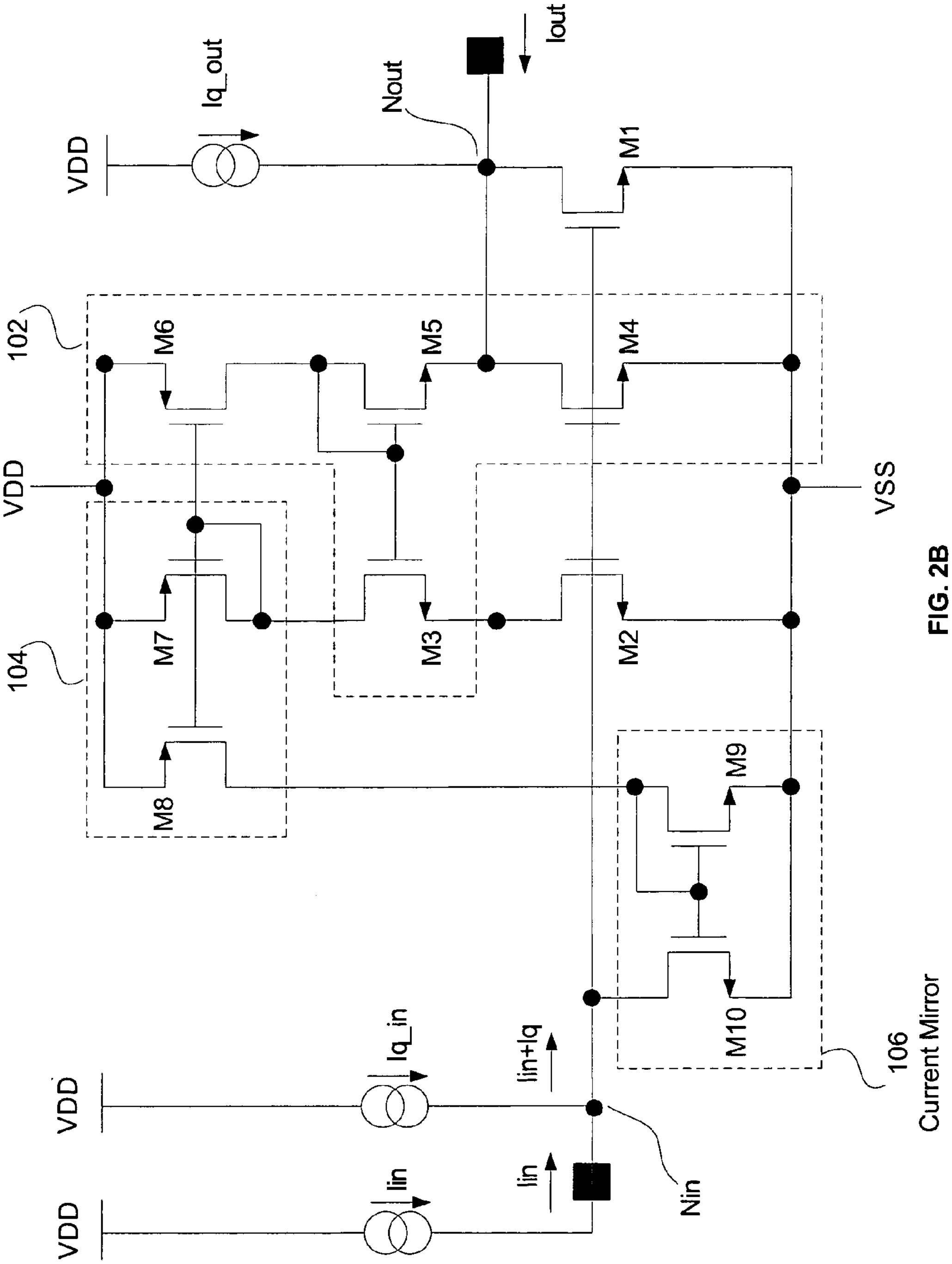
FIG. 2B is similar to the circuit diagram of FIG. 2A, but with the addition of biasing currents.

A biasing current Iq_out can be added at the output node (Nout), as shown in FIG. 2B. This is useful if there is no external pull-up device at the output node (Nout). If the bias current is added at the input, then typically a suitable input bias current Iq_in should also be added to the input current (Iin) to maintain a zero offset output current (Iout).

There is a small feedback response lag at the input node (Nin) due to the delay of the feedback loop that includes transistors M2, M3, M7, M8, M9 and M10. This feedback lag helps speed-up the transient response by applying a little peaking in the frequency response characteristics. If necessary, the size of the transistors can be adjusted, and/or pole-zero type compensation can be added, to control the resulting peaking. The overall current gain from the input (Nin) to the output (Nout) influences the bandwidth of the output stage, and in turn the amount of peaking seen. Experimentation as shown that a current gain ratio of around eight seems to provide the best results. This can be accomplished, e.g., by making transistor M1 eight times as large as transistor M2.

Figure 3:
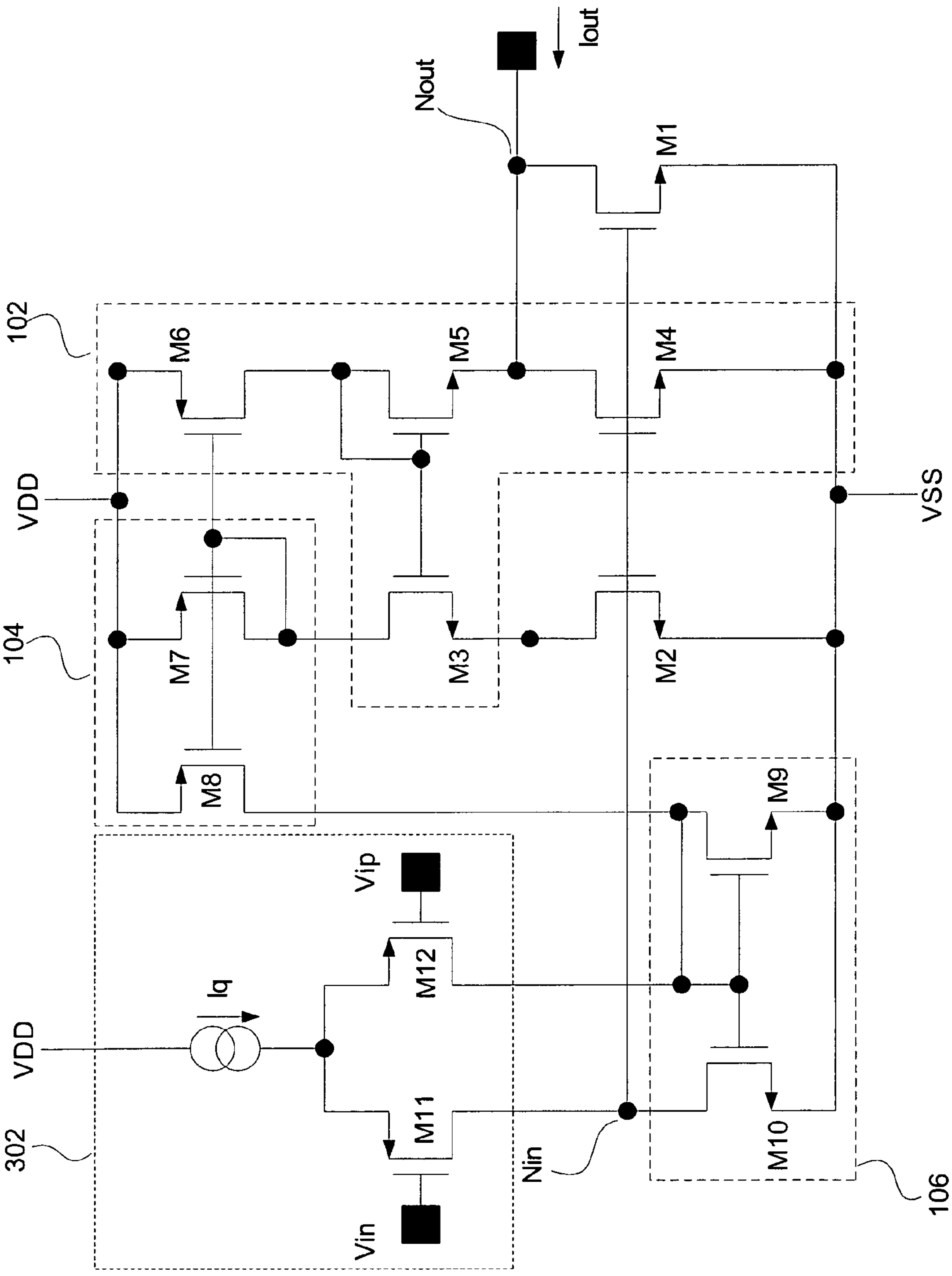
FIG. 3 is a circuit diagram that provides a current output stage with a differential input, in accordance with an embodiment of the present invention.

The above described current output stages have essentially a one-sided output that is ideal for signals that move only in one direction relative to a static (e.g., zero) operating point. Bi-directional modulation requires a suitable input bias current Iq_in to ensure class-A operation. The application of an additional suitably scaled bias current at the output, Iq_out, will prevent the added input bias current from flowing into the load. If a differential input and a single-ended output are required, then the current output stage circuit variant shown in FIG. 3 can be used. Referring to FIG. 3, in accordance with an embodiment of the present invention, a differential input stage 302 includes transistors M11 and M12. The sources of transistors M11 and M12 are shown as receiving a biasing current Iq. The gates of transistors M11 and M12 accept a differential voltage input, labeled Vin and Vip. The drain of transistor M11 is connected to the drain of transistor M10, and the drain of transistor M12 is connected to the drain and the gate of transistor M9. This provides for a differential to single-ended conversion. In a similar manner as shown in FIG. 2B, biasing currents can be added at the input node (Nin) and output node (Nout) of FIG. 3 to allow bi-directional operation.

While in the above discussed FIGS. transistors M1–M5 are shown as NMOS transistors, and transistors M6–M7 are shown as PMOS transistors, one of ordinary skill in the art would understand that transistors M1–M5 can be replaced with N-channel bipolar junction (BJT) transistors, and transistors M6–M7 can be replaced with P-channel BJT transistors. Other types of transistors can also be used.

The above discussed circuit schematics, as shown, provide current sink output stages, which can also be also referred to as current sink drivers. One of ordinary skill in the art would appreciate that the circuits could essentially be flipped by replacing NMOS transistors with PMOS transistors, and PMOS transistors with NMOS transistors, and appropriately adjusting the supply rail voltages. The same holds true for replacing N-channel BJT transistors with P-channel BJT transistor, and replacing P-channel BJT transistors with N-channel BJT transistors. The flipped circuits would result in current source drivers, instead of current sink drivers.

Figure 4:
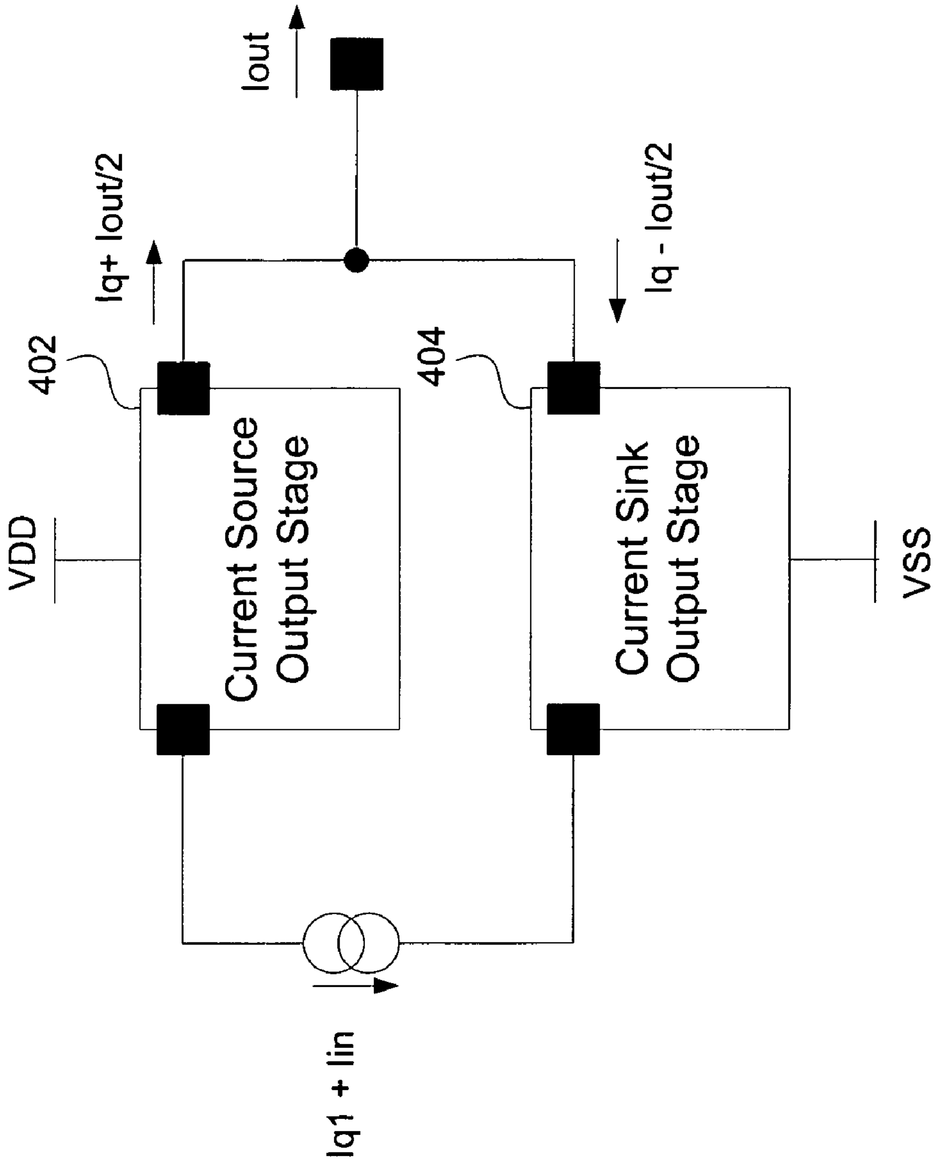
FIG. 4 is a circuit diagram that combines two output stages to provide for a differential push-pull output, in accordance with an embodiment of the present invention.

Referring now to FIG. 4, if a differential push-pull output is desired, then two current output stages of the present invention, one current sink type 404, and one current source type 402, can be used in parallel and driven in anti-phase to create a true differential output driver. As just mentioned above, the circuits as specifically shown in FIGS. 1–3 are current sink type output stages. Current source type output stages can be produced by flipping the circuits of FIGS. 1–3, as just explained above.

Embodiments of the present invention can be useful, e.g., in the area of optical storage devices. For a more specific example, embodiments of the present invention can be used for driving signals from a main circuit board of an optical storage device, through a flex circuit, to an optical pickup unit (OPU) that includes a laser driver, or vice versa. Embodiments of the present invention are also useful for other applications where it is desirable to provide high-speed, high-accuracy and high output swing from a single compact design. Accordingly, embodiments of the present invention should not be limited to use with optical storage devices.

The forgoing description is of the preferred embodiments of the present invention. These embodiments have been provided for the purposes of illustration and description, but are not intended to be exhaustive or to limit the invention to the precise forms disclosed. Many modifications and variations will be apparent to a practitioner skilled in the art. Embodiments were chosen and described in order to best describe the principles of the invention and its practical application, thereby enabling others skilled in the art to understand the invention. Slight modifications and variations are believed to be within the spirit and scope of the present invention. It is intended that the scope of the invention be defined by the following claims and their equivalents.

What is claimed is:

1. A current output stage having an input and an output, the current output stage composing:

a first transistor including a gate connected to the input of the current output stage, a drain connected to the output of the current output stage, and a source;

a second transistor including a gate connected to the input of the current output stage, a source connected to the source of the first transistor, and a drain;

a third transistor including a source connected to the drain of the second transistor, a gate, and a drain;

a first current mirror including an input connected to the drain of the third transistor, and an output; and a second current mirror including an input connected to the output of the first current mirror, and an output connected to the input of the current output stage;

wherein the third transistor is part of a voltage follower circuit that causes a voltage at the source of the third transistor to follow a voltage at the output of the current output stage.

2. The current output stage of claim 1, wherein a signal provided at the input of the current output stage is substantially cancelled by a feedback signal at the output of the second current mirror, thereby limiting swings at the input of the current output stage to relatively small swings, while allowing relatively larger swings at the output of the current output stage.

3. The current output stage of claim 1, wherein the voltage follower circuit further comprises a feedback amplifier including a non-inverting input connected to the output of the current output stage, an inverting input connected to the source of the third transistor, and an output connected to the gate of the third transistor.

4. The current output stage of claim 1, wherein the voltage follower circuit further comprises:

a fourth transistor including a gate connected to the input of the current output stage, a drain connected to the output of the current output stage, and a source connected to the source of the first transistor and the source of the second transistor;

a fifth transistor including a gate and a drain connected together and to the gate of the third transistor, and a source connected to the output of the current output stage; and a sixth transistor connected in a common source configuration and a common gate configuration with transistors of the first current mirror, and including a drain connected to the drain of the fifth transistor.

5. The current output stage of claim 4, wherein the source of the first transistor, the source of the second transistor and the source of the fourth transistor are all connected to a first supply rail voltage.

6. The current output stage of claim 5, wherein the first current mirror includes:

a seventh transistor including a gate and a drain connected together and forming the input of the first current mirror, and a source connected to a second supply rail voltage; and an eighth transistor including a gate connected to the gate of the seventh transistor, a source connected to the second supply rail voltage, and a drain forming the output of the first current mirror.

7. The current output stage of claim 6, wherein the second current mirror includes:

a ninth transistor including a gate and a drain connected together and forming the input of the second current mirror, and a source connected to the first supply rail voltage; and a tenth transistor including a gate connected to the gate of the ninth transistor, a source connected to the first supply rail voltage, and a drain forming the output of the second current mirror.

8. The current output stage of claim 7, wherein each of the first, second, third, fourth, fifth, ninth and tenth transistors comprises an NMOS transistor; and each of the sixth, seventh and eighth transistors comprises a PMOS transistor.

9. The current output stage of claim 7, wherein each of the first, second, third, fourth, fifth, ninth and tenth transistors comprises a PMOS transistor; and each of the sixth, seventh and eighth transistors comprises an NMOS transistor.

10. The current output stage of claim 1, wherein:

the input of the current output stage accepts a single ended current input; and the output of the current output stage provides a single ended current output.

11. The current output stage of claim 1, wherein:

the input of the current output stage is connected to a differential input stage adapted to receive a differential voltage input.

12. The current output stage of claim 1, wherein the voltage follower circuit further comprises:

a fourth transistor including a gate and a drain connected together and to the gate of the third transistor, and a source connected to the output of the current output stage; and a fifth transistor connected in a common source configuration and a common gate configuration with transistors of the first current mirror, and including a drain connected to the drain of the fourth transistor.

13. The current output stage of claim 12, wherein:

each of the first, second, third and fourth transistors, and each transistor of the second current mirror, comprises an NMOS transistor; and the fifth transistor, and each transistor of the first current mirror, comprises a PMOS transistor.

14. The current output stage of claim 12, wherein:

each of the first, second, third and fourth transistors, and each transistor of the second current mirror, comprises a PMOS transistor; and the fifth transistor, and each transistor of the first current mirror, comprises an NMOS transistor.

15. A current output stage having an input and an output, the current output stage comprising:

a first transistor including a control terminal connected to the input of the current output stage, and a current path connected between the output of the current output stage and a first supply rail voltage;

a second transistor including a control terminal connected to the input of the current output stage, and a current path;

a third transistor including a control terminal and a current path;

a first current mirror including an input connected to the current path of the third transistor, and an output, wherein the first current mirror is connected to a second supply rail voltage;

a second current mirror including an input connected to the output of the first current mirror, and an output connected to the input of the current output stage, wherein the second current mirror is connected to the first supply rail voltage;

wherein the current path of the second transistor is connected between the current path of the third transistor and the first supply rail voltage; and wherein the third transistor is part of a voltage follower circuit that causes a voltage, at a node between the current path of the third transistor and the current path of the second transistor, to follow a voltage at the output of the current feedbaek output stage.

16. The current output stage of claim 15, wherein a signal provided at the input of the current output stage is substantially cancelled by a feedback signal at the output of the second current mirror, thereby limiting swings at the input of the current output stage to relatively small swings, while allowing relatively larger swings at the output of the current output stage.

17. The current output stage of claim 15, wherein each of the first, second and third transistors comprises a MOSFET transistor.

18. The current output stage of claim 17, wherein each control terminal comprises a gate terminal, and each current path comprises a drain-source path.

19. The current output stage of claim 15, wherein each of the first, second and third transistors comprises a BJT transistor.

20. The current output stage of claim 19, wherein each control terminal comprises a base terminal, and each current path comprises a collector-emitter path.

21. The current output stage of claim 15, wherein the voltage follower circuit further comprises a feedback amplifier including a non-inverting input connected to the output of the current output stage, an inverting input connected to the node between the current path of the third transistor and the current path of the second transistor, and an output connected to the control terminal of the third transistor.

22. The current output stage of claim 15, wherein the voltage follower circuit further comprises:

a fourth transistor including a control terminal connected to the input of the current output stage, and a current path connected between the output of the current output stage and the first supply rail voltage;

a fifth transistor including a control terminal, and current path including a first terminal and a second terminal, the first terminal connected to the control terminal, the second terminal connected to the output of the current output stage; and a sixth transistor including a control terminal and a current path, the control terminal connected to control terminals of transistors of the first current mirror, the current path connected between the second supply rail voltage and the first terminal of the current path of the fifth transistor.

23. The current output stage of claim 22, wherein:

each of the first, second, third, fourth and fifth transistors, and each transistor of the second current mirror, comprises an N-channel transistor; and the sixth transistor, and each transistor of the first current mirror, comprises a P-channel transistor.

24. The current output stage of claim 22, wherein:

each of the first, second, third, fourth and fifth transistors, and each transistor of the second current mirror, comprises a P-channel transistor; and the sixth transistor, and each transistor of the first current mirror, comprises an N-channel transistor.

25. The current output stage of claim 15, wherein:

the input of the current output stage accepts a single ended current input; and the output of the current output stage provides a single ended current output.

26. The current output stage of claim 15, wherein:

the input of the current output stage is connected to a differential input stage adapted to receive a differential voltage input.

27. The current output stage of claim 15, wherein the voltage follower circuit further comprises:

a fourth transistor including a control terminal, and current path including a first terminal and a second terminal, the first terminal connected to the control terminal, the second terminal connected to the output of the current output stage; and a fifth transistor including a control terminal and a current path, the control terminal connected to control terminals of transistors of the first current mirror, the current path connected between the second supply rail voltage and the first terminal of the current path of the fourth transistor.

28. The current output stage of claim 27, wherein:

each of the first, second, third and fourth transistors, and each transistor of the second current mirror, comprises an N-channel transistor; and the fifth transistor, and each transistor of the first current mirror, comprises a P-channel transistor.

29. The current output stage of claim 27, wherein:

each of the first, second, third and fourth transistors, and each transistor of the second current mirror, comprises a P-channel transistor; and the fifth transistor, and each transistor of the first current mirror, comprises an N-channel transistor.

30. A current output stage having an input and an output, the current output stage comprising:

a voltage follower circuit that includes a feedback amplifier and a transistor a a first current mirror including an input and an output; and a second current mirror including an input connected to the output of the first current mirror, and an output connected to the input of the current output stage;

wherein the feedback amplifier includes first and second inputs and an output, the first input being connected to the output of the current output stage; and wherein the transistor includes a control terminal and a current path, the control terminal connected to the output of the feedback amplifier, and the current path connecting the second input of the feedback amplifier to the input of the first current mirror.

31. A current output stage having an input and an output, the current output stage comprising:

a voltage follower circuit that includes a node having a voltage that follows a voltage at the output of the current output stage;

a first current mirror including an input connected to the node of the voltage follower circuit that follows the voltage at the output node of the current output stage, and an output; and a second current mirror including an input connected to the output of the first current mirror, and an output connected to the input of the current output stage;

wherein a signal provided at the input of the current output stage is substantially cancelled by a feedback signal at the output of the second current mirror, thereby limiting swings at the input of the current output stage to relatively small swings, while allowing relatively larger swings at the output of the current output stage.

32. The current output stage of claim 31, wherein a current path of a transistor connects the node of the voltage follower circuit to the input of the first current mirror.

33. A current output stage having an input and an output, the current output stage comprising:

a transistor including a control terminal and a current path, the current path including a first terminal and a second terminal, the control terminal being connected to the input of the current output stage, and the first terminal connected to the output of the current output stage;

a voltage follower circuit that includes a node having a voltage that follows a voltage at the output of the current output stage;

a first current mirror including an input and an output, the input connected to the node of the voltage follower circuit that follows the voltage at the output of the current output stage; and a second current mirror including an input and an output, the input connected to the output of the first current mirror, and the output connected to the input of the current output stage.

34. The current output stage of claim 33, wherein a signal provided at the input of the current output stage is substantially cancelled by a feedback signal at the output of the second current mirror, thereby limiting swings at the input of the current output stage to relatively small swings, while allowing relatively larger swings at the output of the current output stage.

35. The current output stage of claim 33, wherein a current path of a further transistor connects the node of the voltage follower circuit to the input of the first current mirror.

36. A method for providing a current output stage with high-impedance, high-speed, high-accuracy and high-output swing, comprising:

accepting an input signal at an input node;

providing an output signal, based on the input signal, at an output node;

producing a feedback signal indicative of a voltage at the output node; and using the feedback signal to substantially cancel the input signal at the input node, to thereby limit swings at the input node, while allowing relatively larger swings in the output signal at the output node.

* * * * *

UNITED STATES PATENT AND TRADEMARK OFFICE

CERTIFICATE OF CORRECTION

PATENT NO. : 7,053,699 B2
APPLICATION NO. : 10/843253
DATED : May 30, 2006
INVENTOR(S) : Brian North It is certified that error appears in the above-identified patent and that said Letters Patent is hereby corrected as shown below:

Column 1, line 22, delete “drain” and insert therefor --gate--.

Signed and Sealed this

Eighth Day of August, 2006

JON W. DUDAS
*Director of the United States Patent and Trademark Office*